(12) United States Patent
Kim

(10) Patent No.: US 6,958,289 B2
(45) Date of Patent: Oct. 25, 2005

(54) METHOD OF FORMING METAL LINE IN SEMICONDUCTOR DEVICE

(75) Inventor: Tae Kyung Kim, Kyungki-do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/878,811

(22) Filed: Jun. 28, 2004

(65) Prior Publication Data

US 2005/0101121 A1    May 12, 2005

(30) Foreign Application Priority Data

Nov. 11, 2003    (KR) ...................... 10-2003-0079422

(51) Int. Cl.⁷ .......................................... H01L 21/4763
(52) U.S. Cl. ...................... 438/634; 438/638; 438/675
(58) Field of Search .................... 438/634, 638, 438/672, 675, 687

(56) References Cited

U.S. PATENT DOCUMENTS 6,271,135 B1 * 8/2001 Palmans et al. ............ 438/672
6,395,632 B1 * 5/2002 Farrar ........................ 438/687
6,410,425 B1 * 6/2002 Verove ....................... 438/638

* cited by examiner

Primary Examiner—Chandra Chaudhari
(74) Attorney, Agent, or Firm—Marshall, Gerstein & Borun LLP

(57) ABSTRACT

The present invention discloses a method for forming a metal line in a semiconductor device including the steps of: sequentially forming a first insulation film, an etch barrier film and a second insulation film on a semiconductor substrate on which the substructure has been formed; forming a plurality of via holes for exposing the substructure in different points by patterning the second insulation film, the etch barrier film and the first insulation film of the resulting structure, and forming a plurality of trench patterns respectively on the plurality of via holes by re-patterning the second insulation film and the etch barrier film of the resulting structure; forming a plurality of vias and trenches by filling a metal material in the plurality of via holes and trench patterns; removing the second insulation film; and forming a third insulation film over the resulting structure including the removed second insulation film.

8 Claims, 2 Drawing Sheets

METHOD OF FORMING METAL LINE IN SEMICONDUCTOR DEVICE

BACKGROUND

1. Field of the Invention

The present invention relates to a method for manufacturing a semiconductor device, and more particularly to, a method for forming a metal line in a semiconductor device according to a damascene process.

2. Discussion of Related Art

Recently, an insulation film for a metal line is not easily obtained due to a high integration tendency of a semiconductor device, and thus a process for forming a metal line by using a damascene process increasingly generates a short between the metal lines, namely a crosstalk. That is, in the process for forming the metal line by forming trench patterns, it is important to form the insulation film over a predetermined ratio to the metal line in the same pitch. However, the insulation film is excessively removed due to general processes such as a photoetching process, a cleaning process performed before filling a metal material, and a plariarization process performed after filling the metal material, and thus has a smaller width than a wanted value.

The metal line is formed by filling the metal material in the trench patterns defined by the insulation film. Here, a width between the adjacent metal lines is reduced, to generate interferences between the metal lines, namely crosstalk. As a result, reliability of the metal line decreases.

SUMMARY OF THE INVENTION

The present invention is directed to a method for forming a metal line in a semiconductor device which can prevent reliability of the metal line from being reduced due to a high integration tendency of the semiconductor device.

One aspect of the present invention is to provide a method for forming a metal line in a semiconductor device, including the steps of: sequentially forming a first insulation film, an etch barrier film and a second insulation film on a semiconductor substrate on which the substructure has been formed; forming a plurality of via holes for exposing the substructure in different points by patterning the second insulation film, the etch barrier film and the first insulation film of the resulting structure, and forming a plurality of trench patterns respectively on the plurality of via holes by re-patterning the second insulation film and the etch barrier film of the resulting structure; forming a plurality of vias and trenches by filling a metal material in the plurality of via holes and trench patterns; removing the second insulation film; and forming a third insulation film over the resulting structure including the removed second insulation film.

Preferably, the step for removing the second insulation film reduces a width and thickness of the trenches as well as a thickness of the etch barrier film.

Preferably, the step for removing the second insulation film is one of a wet dip process and a dry etching process.

Preferably, the wet dip process uses an appropriate etching solution for reducing the metal material filled in the trenches by a predetermined thickness after removing the second insulation film, by using one of BOE (20:1 to 300:1), HF (50:1 to 100:1) and a mixing solution of BOE and HF.

Preferably, the dry etching process uses an appropriate etching gas for reducing the metal material filled in the trenches by a predetermined thickness after removing the second insulation film, by using a combination of $C_5F_8+O_2/CF_4+CH_2F_2/CHF_3+O_2$.

Preferably, the first insulation film is one of $SiO_2$ film, BPSG film, PSG film, FSG film, PE-TEOS film, $PE-SiH_4$ film, HDP USG film, HDP PSG film and APL oxide film.

Preferably, the second insulation film is one of SiN film and SiON film.

Preferably, the third insulation film is formed by using a dielectric film having a dielecric constant k equal to or less than 3.

DETAILED DESCRIPTION OF PREFERRED EMBODIMENTS

Figure 1:
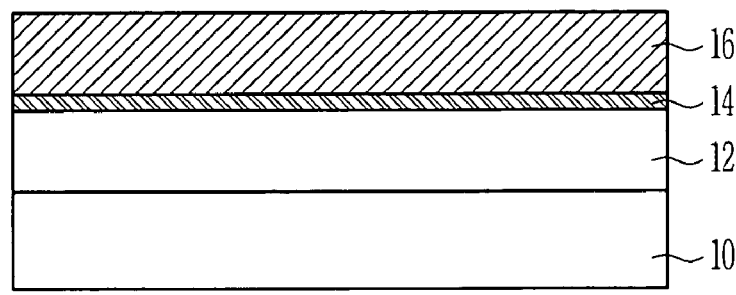
FIGS. 1 to 5 are cross-sectional diagrams illustrating sequential steps of a method for forming a metal line in a semiconductor device in accordance with a preferred embodiment of the present invention.

A method for forming a metal line in a semiconductor device in accordance with a preferred embodiment of the present invention will now be described in detail with reference to the accompanying drawings. In the drawings, a thickness of a film is exaggerated to emphasize clear and accurate explanations. Wherever possible, the same reference numerals will be used throughout the drawings and the description to refer to the same or like parts. In addition, in case it is described that one film is disposed on or contacts another film or a semiconductor substrate, one film can directly contact another film or the semiconductor substrate, or the third film can be positioned between them.

FIGS. 1 to 5 are cross-sectional diagrams illustrating sequential steps of the method for forming the metal line in the semiconductor device in accordance with the preferred embodiment of the present invention.

Referring to FIG. 1, a first insulation film 12, an etch barrier film 14 and a sacrificial oxide film 16 are sequentially formed on a semiconductor substrate 10 on which a substucture such as a transistor has been formed. The sacrificial oxide film 16 is an oxide film such as $SiO_2$ film, BPSG film, PSG film, FSG film, PE-TEOS film, $PE-SiH_4$ film, HDP USG film, HDP PSG film and APL oxide film, and formed at a thickness of 2000 to 4000 Å. The etch barrier film 14 is a nitride film such as SiN film or SiON film, and formed at a thickness of 300 to 1000 Å. The sacrificial oxide film 16 is removed in a succeeding process, and thus preferably comprised of an easily-removable film.

Figure 2:
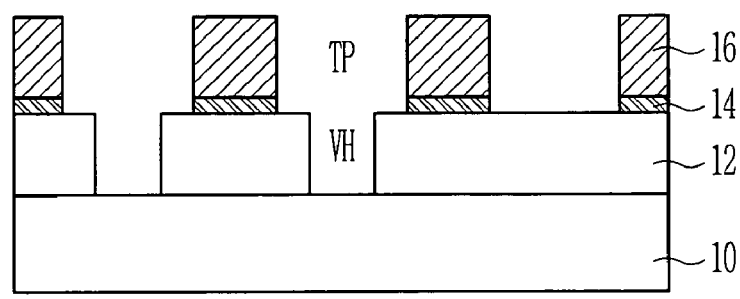

As shown in FIG. 2, a dual damascene process is performed to expose the substructure formed on the semiconductor substrate 10, thereby forming via holes VH and trench patterns TP. That is, first photoresist patterns (not shown) for defining the via holes VH are formed on the sacrificial oxide film 16 formed on the semiconductor substrate 10, and the sacrificial oxide film 16, the etch barrier film 14 and the first insulation film 12 are etched by using the first photoresist patterns (not shown) as an etch mask, to form the via holes VH for exposing the substructure. The first photoresist patterns (not shown) are removed. Second photoresist patterns (not shown) for defining the trench patterns TP are formed on the sacrificial oxide film 16 of the resulting structure on which the via holes VH have been formed, and the sacrificial oxide film 16 and the etch barrier film 14 are etched by using the second photoresist patterns (not shown) as an etch mask, to form the trench patterns TP. The second photoresist patterns (not shown) are removed.

Figure 3:
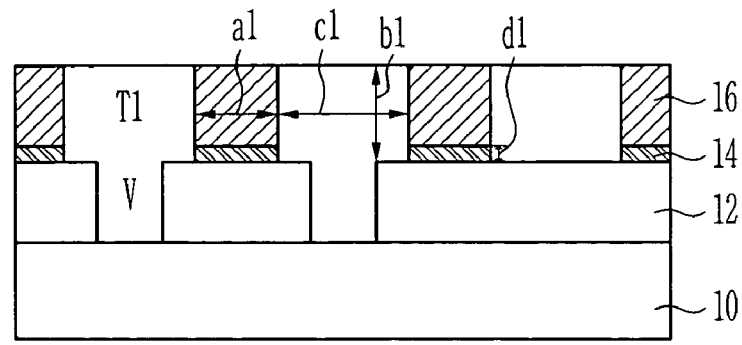

As depicted in FIG. 3, a diffusion barrier film (not shown) and a metal seed layer (not shown) such as a Cu seed layer are sequentially formed on the whole surface of the semiconductor substrate 10 including the via holes VH and the trench patterns TP, and a metal layer (not shown) such as a Cu layer is formed according to an electro-plating process. A planarization process is performed on the metal layer (not shown) to expose the sacrificial oxide film 16, so that the metal layer (not shown) can be filled merely in the via holes VH and the trench patterns TP. Thus, formation of vias V and first trenches T1 is finished. The metal layer can be formed by using W, TiSix, TiN and Al, instead of Cu.

Figure 4:
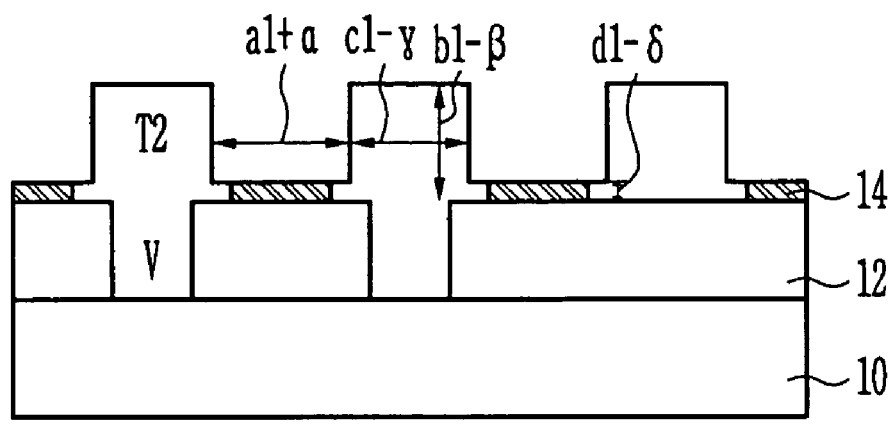

As illustrated in FIG. 4, after the vias V and the first trenches T1 are formed, a wet dip process or a dry etching process is performed. Therefore, the sacrificial oxide film 16 is removed, and the surface and sides of the first trenches T1 are slightly removed, to form second trenches T2.

According to the above process, the width $c1-\gamma$ and thickness $b1-\beta$ of the second trenches T2 are smaller than the width (c1 of FIG. 3) and thickness (b1 of FIG. 3) of the first trenches T1. Thus, a width between the adjacent second trenches T2 increases (width between the first trenches T1 is a1 of FIG. 3, and width between the second trenches T2 is $a1+\alpha$), to restrict generation of interferences between the trenches T2, namely crosstalk. In addition, the etch barrier film 14 is etched by a predetermined depth (depth of the etch barrier film 14 before the etching process is d1 of FIG. 3, the depth of the etch barrier film 14 after the etching process is $d1-\delta$), to more restrict generation of interferences between the trenches T2, namely crosstalk, and to prevent the first insulation film 12 from being etched.

The wet dip process uses an appropriate etching solution for reducing the metal material filled in the trenches T1 by a predetermined thickness after removing the oxide film, by using one of BOE (20:1 to 300:1), HF (50:1 to 100:1) and a mixing solution of BOE and HF.

In this embodiment, an etching solution for removing a Cu material, namely $HNO_3$ or $H_2SO_4$ mixed at a ratio of 20 to 500:1 is used. In the case that a metal material such as W, TiSix, TiN and Al is filled in the trenches T1 instead of Cu, an appropriate etching solution can also be used.

The dry etching process uses an appropriate etching gas for reducing the metal material filled in the trenches T1 by a predetermined thickness after removing the oxide film, by using a combination of $C_5F_{8+O2}/CF_4+CH_2F_2/CHF_{3+O2}$.

In this embodiment, an etching gas for removing a Cu material, namely a gas containing F or Cl groups is used. In addition, when a metal material such as W, TiSix, TiN and Al is filled in the trenches T1 instead of Cu, an appropriate etching gas can also be used.

Figure 5:
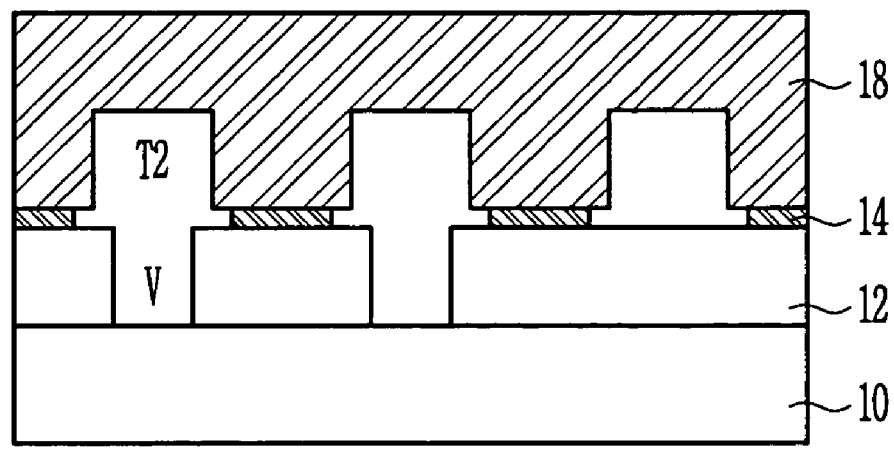

As shown in FIG. 5, a second insulation film 18 comprised of a tow dielectric film is formed over the resulting structure. The second insulation film 18 formed on the whole surface of the resulting structure serves as an inter metal dielectric film for insulating the adjacent second trenches T2. Preferably, the second insulation film 18 comprised of the low dielectric film (having k equal to or less than 3) is formed according to the PECVD or APCVD. In order to reduce capacitance between the metal lines, the interlayer insulation film between the trenches T2 is formed by using the second insulation film 18 comprised of the low dielectric film.

A process for forming metal contacts (not shown) by forming contact holes (not shown) connected to the second trenches T2 by patterning the second insulation film 18, and filling a metal material in the contact holes (not shown) can be additionally performed.

For supplementary explanations, generation of crosstalk can be restricted by increasing the width between the metal lines and decreasing the height of the metal lines. Accordingly, the width and thickness of the metal lines is reduced by removing the sacrificial oxide film 16. Moreover, the low dielectric film for restricting generation of crosstalk can be additionally formed by removing the etch barrier film 14. That is, removal of the etch barrier film 14 also restricts generation of crosstalk.

In accordance with the present invention, the process for removing the sacrificial oxide film 16 is performed after forming the trench patterns on the sacrificial oxide film 16, thereby removing the sacrificial oxide film 16, etching the metal lines by a predetermined width and thickness, and etching the etch barrier film 14 by a predetermined thickness. Therefore, the width between the metal lines increases, and the low dielectric film is formed between the metal lines, to restrict generation of interferences between the adjacent metal lines, namely crosstalk. As a result, reliability of the metal lines is improved.

As discussed earlier, in accordance with the present invention, the process for removing the sacrificial oxide film 16 is performed after forming the trench patterns on the sacrificial oxide film 16, thereby removing the sacrificial oxide film 16, etching the metal lines by a predetermined width and thickness, and etching the etch barrier film 14 by a predetermined thickness. Therefore, the width between the metal lines increases, and the low dielectric film is formed between the metal lines, to restrict generation of interferences between the adjacent metal lines, namely crosstalk. As a result, reliability of the metal lines is improved.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A method for forming a metal line in a semiconductor device, comprising the steps of:
   sequentially forming a first insulation film, an etch barrier film and a second insulation film on a semiconductor substrate on which a substructure has been formed;
   forming a plurality of via holes for exposing the substructure in different points by patterning the second insulation film, the etch barrier film and the first insulation film of the resulting structure, and forming a plurality of trench patterns respectively on the plurality of via holes by re-patterning the second insulation film and the etch barrier film of the resulting structure;
   forming a plurality of vias and trenches by filling a metal material in the plurality of via holes and trench patterns;
   removing the second insulation film; and
   forming a third insulation film over the resulting structure including the removed second insulation film.

2. The method of claim 1, wherein the step for removing the second insulation film reduces a width and thickness of the trenches as well as a thickness of the etch barrier film.

3. The method of claim 1, wherein the step for removing the second insulation film is one of a wet dip process and a dry etching process.

4. The method of claim 3, wherein the wet dip process uses an appropriate etching solution for reducing the metal material filled in the trenches by a predetermined thickness after removing the second insulation film, by using one of BOE (20:1 to 300:1), HF (50:1 to 100:1) and a mixing solution of BOE and HF.

5. The method of claim 3, wherein the dry etching process uses an appropriate etching gas for reducing the metal material filled in the trenches by a predetermined thickness after removing the second insulation film, by using a combination of $C_5F_8+O_2/CF_4+CH_2F_2/CHF_3+O_2$.

6. The method of claim 1, wherein the first insulation film is one of $SiO_2$ film, BPSG film, PSG film, FSG film, PE-TEOS film, $PE-SiH_4$ film, HDP USG film, HDP PSG film and APL oxide film.

7. The method of claim 1, wherein the second insulation film is one of SiN film and SiON film.

8. The method of claim 1, wherein the third insulation film is formed by using a dielectric film having a dielectric constant k equal to or less than 3.

* * * * *